US007518463B2

(12) United States Patent
Fojas

(10) Patent No.: US 7,518,463 B2
(45) Date of Patent: Apr. 14, 2009

(54) CIRCUIT ASSEMBLY WITH CONICAL INDUCTOR

(75) Inventor: Uriel C. Fojas, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 25 days.

(21) Appl. No.: 11/021,839

(22) Filed: Dec. 23, 2004

(65) Prior Publication Data

US 2006/0139124 A1 Jun. 29, 2006

(51) Int. Cl.
*H03H 7/00* (2006.01)
*H01F 27/30* (2006.01)

(52) U.S. Cl. .......................... 333/12; 333/185; 336/231

(58) Field of Classification Search ................... 333/12, 333/181, 185, 246, 247; 336/65, 200, 208, 336/231
See application file for complete search history.

(56) References Cited

U.S. PATENT DOCUMENTS

| | | | | |
|---|---|---|---|---|
| 4,314,220 | A * | 2/1982 | Ito et al. | 336/65 |
| 4,400,674 | A * | 8/1983 | Suda et al. | 336/65 |
| 5,319,329 | A * | 6/1994 | Shiau et al. | 333/204 |
| 6,236,289 | B1 | 5/2001 | Slenker | |
| 6,292,081 | B1 * | 9/2001 | Armfield et al. | 336/65 |
| 6,344,781 | B1 | 2/2002 | Slenker | |
| 6,856,229 | B2 * | 2/2005 | Ogawa et al. | 336/200 |
| 2002/0080002 | A1 * | 6/2002 | Oldfield et al. | 336/231 |
| 2005/0093670 | A1 * | 5/2005 | Neumann et al. | 336/208 |
| 2005/0121224 | A1 * | 6/2005 | Lien | 174/250 |

FOREIGN PATENT DOCUMENTS

| | | | |
|---|---|---|---|
| EP | 443173 | A1 * | 8/1991 |
| JP | 2004006696 | A * | 1/2004 |
| JP | 2004193886 | A * | 7/2004 |

OTHER PUBLICATIONS

The American Heritage College Dictionary, 4th Edition, 2002, p. 1305.*

* cited by examiner

*Primary Examiner*—Seungsook Ham

(57) ABSTRACT

A circuit assembly has a conical inductor disposed in a slot formed in a substrate.

13 Claims, 2 Drawing Sheets

CIRCUIT ASSEMBLY WITH CONICAL INDUCTOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Inductors are used in radio frequency ("RF") and microwave circuits in a wide variety of applications. A coil of fine wire is often used to generate inductance; however, physical inductors do not provide pure inductance. The coils of an inductor capacitively couple to each other, generating what is commonly known as parasitic capacitance, also known as stray capacitance. Stray capacitances also arise from other sources, such as the inductor coils coupling to and/or through other structures of the circuit in which the inductor is used. The combination of the inductance and parasitic capacitance forms an inductance-capacitance ("LC") circuit having a resonant frequency, commonly called the self-resonant frequency.

Stray capacitance is undesirable for inductors that will be used in broad-band high-frequency applications, such as RF chokes used in bias tees, because it reduces the self-resonant frequency of the inductor. The series self-resonant frequency is the frequency at which the inductor appears as a short circuit. Conical coils, also referred to as conical inductors, are used to extend the operating range of RF chokes by increasing the series self-resonant frequency compared to a cylindrical coil having a diameter equal to the wide end of the conical inductor, while providing good low-frequency performance. Basically, the conical inductor acts like a series of progressively (physically) larger inductors, moving from the narrow end to the wide end. Conical inductors are further described in U.S. Pat. Nos. 6,344,781 and 6,236,289.

Conventional microwave circuits use special holders to align and support a conical inductor on a substrate (see FIGS. 1A-1D, below). The holder is typically made of plastic and manually attached to the substrate using an adhesive, such as an epoxy adhesive. The substrate has fiducial marks that indicate where the operator should place the holder; however the manufacturing repeatability is relatively low. Then, the conical inductor is placed in the holder and secured with adhesive. The holder holds the conical inductor on its axis, but the conical inductor can slide back and forth in the holder, introducing another source of alignment/placement error. A way to assemble conical inductors on substrates that avoids the disadvantages described above is desired.

BRIEF SUMMARY OF THE INVENTION

A circuit assembly has a conical inductor disposed in a slot formed in a substrate.

DETAILED DESCRIPTION OF THE EMBODIMENTS

Figure 1A:
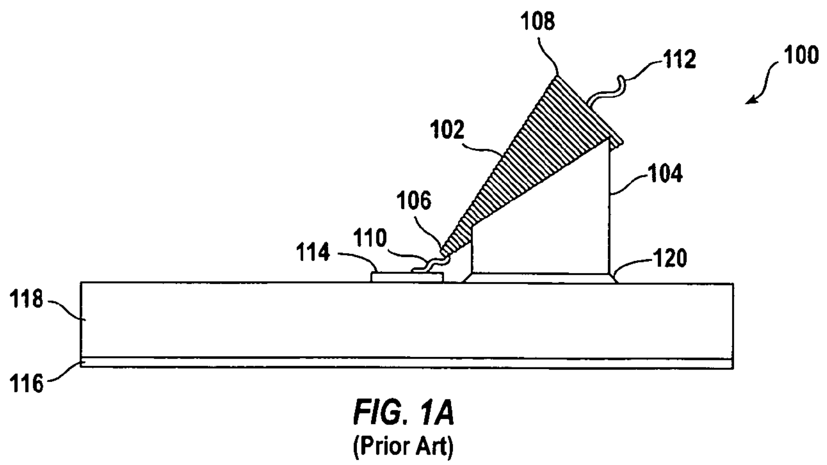
FIG. 1A (Prior Art)
FIG. 1A is a side view of a prior art circuit assembly with a conical inductor mounted in a holder.

FIG. 1A is a side view of a prior art circuit assembly 100 with a conical inductor 102 mounted in a holder 104. The conical inductor 102 has a narrow end 106 and a wide end 108. Leads 110, 112 extend from the narrow end 106 and wide end 108, respectively. The conical inductor 102 is wound from fine, insulated copper wire. The insulation (not shown) is stripped from the ends of the leads 110, 112 for making electrical connections to the conical inductor 102. The conical inductor 102 is filled with iron particles in a binder, commonly referred to as "polyiron," to increase the permeability of the inside of the conical inductor 102 to improve broad-band operation. The lead 110 at the narrow end 106 of the conical inductor is electrically connected to a conductor (often referred to as a "center conductor") 114, which forms a high-frequency microstrip transmission line with a conductive ground plane 116 and a substrate 118. The substrate is made from a dielectric material, such as alumina ceramic, high-alumina (99.6% alumina) ceramic, or sapphire.

The holder 104 is glued to the substrate 118 using epoxy 120 or other adhesive; however, it is undesirable to use a holder to mount a conical inductor for several reasons. In addition to problems arising in repeatable placement of the holder and/or conical inductor, the holder significantly increases the height of the circuit assembly 100. Circuit assemblies such as these are frequently housed in metal packages machined from metal stock. A deeper package body is used with higher circuit assemblies, which removes more material, resulting in more waste. A larger cavity in the package body is also more susceptible to resonance due to a lower cut-off frequency in waveguide modes. However, the holder 104 moves the coils of the conical inductor 102 further away from the ground plane 116. Moving the coils of the conical inductor closer to the conductive ground plane 116 would increase stray capacitance and lower the self-resonant frequency of the conical inductor 102 in the circuit assembly 100.

Unfortunately, the plastic holder 104 also provides a capacitive coupling path between the coils of the conical inductor 102 that lie along (i.e. contact) the holder, which lowers the resonant frequency of the conical inductor. Even if the holder is made from plastic having a low dielectric constant, the adhesive (e.g. epoxy) used to attach the conical inductor to the holder typically has a relatively high dielectric constant, and is in intimate contact with the coils of the conical inductor along the length of the holder.

The holder 104 is also relatively expensive, and in some cases the cost of the holder is about the same as the cost of the conical inductor. Thus, eliminating the holder would result in a significant reduction in the component cost of the circuit assembly. Adhesive is usually applied to the holder and/or substrate, the holder is placed on the substrate, and then the adhesive is cured. The holder can become misaligned before the adhesive is cured, resulting in yield loss or rework. Eliminating the holder would also avoid these problems associated with assembly labor.

Figure 1B:
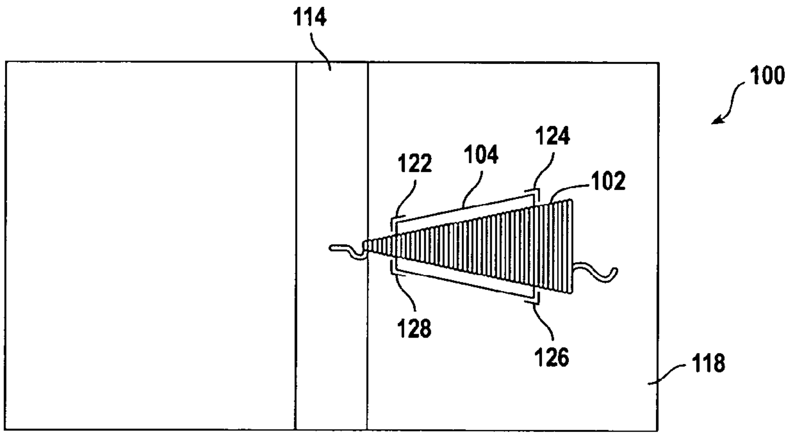
FIG. 1B (Prior Art)
FIG. 1B is a plan view of the circuit assembly of FIG. 1A.

FIG. 1B is a plan view of the circuit assembly 100 of FIG. 1A. The conical inductor 102 is glued to and supported by the holder 104. The holder 104 is glued to the substrate 118. Fiducial marks 122, 124, 126, 128, which are usually patterned from one or more metal layers used to fabricate other structures, such as the center conductor 114, indicate where the holder 104 should be glued to the substrate 118. However, even with fiducial marks, process variations in the dimensions of the holder, and manual placement of the holder on the substrate can result in misalignment and degradation of electrical performance.

Figure 1C:
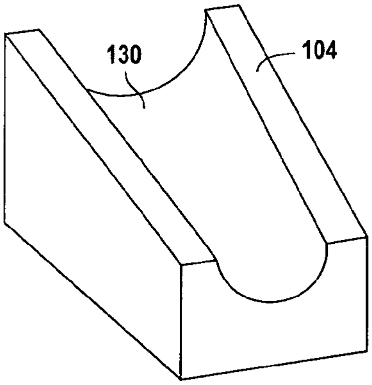
FIG. 1C (Prior Art)
FIG. 1C is an isometric view of a prior art conical inductor holder.
Figure 1D:
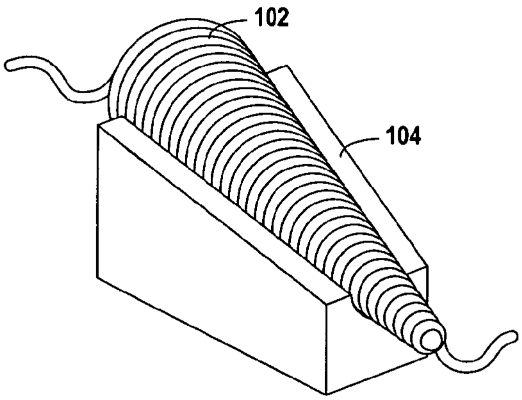
FIG. 1D (Prior Art)
FIG. 1D is an isometric view of a conical inductor in a holder.

FIG. 1C is an isometric view of a prior art conical inductor holder 104. The conical inductor has a tapered groove 130 configured to accept a conical inductor (not shown). Epoxy is typically applied along the length of the tapered groove 130, and in some instances across essentially the entire surface of the tapered groove 130 and/or the conical inductor. The intimate contact of the epoxy with the coils of the conductor increases inter-coil capacitance and degrades the electrical performance of the conical inductor. FIG. 1D is an isometric view of a conical inductor 102 in a holder 104.

Figure 2A:
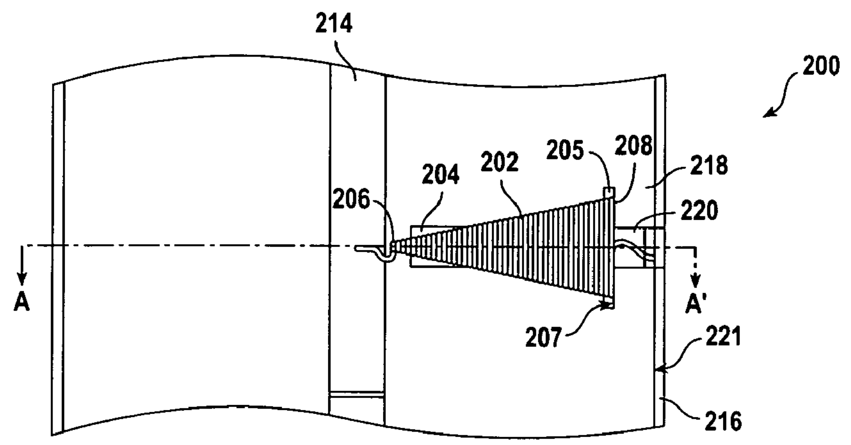
FIG. 2A is a plan view of a circuit assembly according to an embodiment of the invention.

FIG. 2A is a plan view of a circuit assembly 200 according to an embodiment of the invention. A conical inductor 202 is mounted in a slot 204 formed in a substrate 218. The conical inductor is filled with polyiron. Alternatively, the conical inductor is filled with other material, or is not filled. A transverse portion 205 of the slot 204 provides a back wall 207 that determines the position of the wide end 208 of the conical inductor 202 with respect to a center conductor 214 of a microstrip high-frequency transmission line. A cut-out portion 220 extending to the edge 221 of the substrate facilitates removal of the scrap portions of the substrate to form the slot.

The conical inductor 202 is supported on the substrate 218 at only a few points (see FIG. 3, ref. nums. 226, 227, 229), which reduces capacitive coupling between adjacent coils, compared to a conical inductor in a holder (see FIG. 1D, ref. nums. 102, 104), which contacts several coils over a relatively large area (e.g. tapered groove 130 in FIG. 1C). The position of the conical inductor is determined by the back wall 207 in cooperation with the length of the conical inductor. The points at which the conical inductor 202 contacts the substrate 218 (i.e. the width and length of the slot in combination with the dimensions of the conical inductor) determines the tilt of the central axis of the conical inductor from the plane of substrate 218, and the position of the narrow end 206 of the conical inductor 202 with respect to the center conductor 214. Thus, the dimensions of the slot can be chosen to cooperate with a wide variety of conical inductors, and different slots provide many different configurations with any one conical inductor.

The slot 204 is formed using any of several techniques or combinations of techniques, such as sawing, grinding, abrasive jet blasting, etching, or laser cutting. In a particular embodiment, the substrate is a high-alumina (99.6% $Al_2O_3$) substrate about 0.25 mm (0.010 inches) thick and the slot 204 is formed using a laser cutting technique. Alternatively, the substrate is an alumina (e.g. 96% $Al_2O_3$), sapphire, silica, or glass substrate. In yet other embodiments, the substrate is an organic-based substrate.

Conical inductors suitable for use with embodiments of the invention are available from Piconics, Inc., of Tyngsboro, Mass. In a particular embodiment, a conical inductor having a length of about 5.09 mm (0.2 inches) made from AWG size 36 wire having 21 turns that is about 2 mm (0.079 inches) in outside diameter at the wide end of the conical inductor is used.

The substrate 218 is what is commonly known as a "suspended substrate." The substrate has the center conductor 214 defined on its top surface, and is "clear" (i.e. is not metalized) on its bottom surface. A metal package 216 provides the ground plane (see FIG. 2B, ref. num. 217), which is further away from the center conductor than the ground plane 116 in FIG. 1A, for example. This allows forming a transmission line (e.g. a fifty-ohm transmission line) having a wider center conductor on a substrate having a standard thickness. A wider center conductor is desirable for making electrical connections to physically larger components, such as blocking capacitors that are used in series with the center conductor. Blocking capacitors are often used in conjunction with conical inductors to form bias tees. A wider center conductor is also desirable because it reduces the sensitivity of the characteristic impedance of the transmission line to manufacturing tolerances.

Most of the package floor is a selected distance (e.g. about 0.20 mm to about 0.25 mm (8-10 mils)) from the bottom of the substrate 218. The package floor is deeper underneath the conical inductor to reduce coupling of the coils to the metal package (ground). In some embodiments, the package floor is sufficiently deepened to allow the wider end of the coil to protrude below the bottom of the substrate. In a particular embodiment, the ground relief (deepened package floor) is about 3 mm deeper than the ground plane underneath the center conductor 214. In a particular embodiment, the ground relief extends beyond each edge of the conical inductor. Removing the package floor, and hence ground plane, further away from the conical inductor reduces stray capacitances and improves the electrical performance of the conical inductor.

Figure 2B:
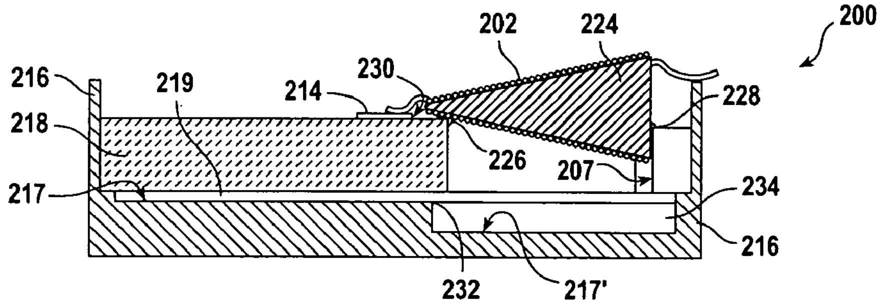
FIG. 2B is a cross section of the circuit assembly of FIG. 2A.

FIG. 2B is a cross section along line A-A' of the circuit assembly 200 of FIG. 2A. The center conductor 214 cooperates with a ground plane 217 formed by the floor of the package 216, the substrate 218, and a gap 219 between the substrate 218 and the ground plane 217 to form a microstrip transmission line. The circuit assembly 200 is not drawn to scale. The conical inductor 202 is filled with polyiron 224 and is glued to the substrate 218 with small amounts of epoxy 226, 228 where the conical inductor 202 contacts the substrate 218 at the edges of the slot and backwall 207. Additional epoxy is used at the other spots (not shown in this view) where the conical inductor contacts the substrate.

The ground plane 217 extends under an edge 230 of the center conductor 214 for a distance 232 sufficient to provide a good return path for the electromagnetic field lines from the center conductor 214 to the ground plane 217. In other words, a recess 234 is set back from the edge 230 of the center conductor a sufficient distance to insure that the microstrip high-frequency transmission line maintains a desired characteristic impedance. The appropriate distance is easily determined according to well-characterized models incorporating the dimensions and materials of microstrip transmission lines. Generally, the package material is removed to form the recess 234, which moves the ground plane (i.e. the floor of the recess 234) 217' further away from the conical inductor. In some embodiments, a recess substantially larger than the conical inductor is removed, if it does not unduly degrade the electrical performance of other elements, such as high-frequency transmission lines. In a particular embodiment, the floor of the recess is about 1 mm below the bottom of the substrate 218. Alternatively, a substrate with a metalized backside providing the ground plane is used (see FIG. 1A, ref.

num. 116), and a portion of the ground plane is cleared away in the vicinity of the conical inductor to avoid stray capacitance between the coils of the conical inductor and the ground plane.

Comparing FIG. 2B with FIG. 1A, the holder 104 is high enough to keep the narrow end 106 of the conical inductor 102 sufficiently far away from the edge of the center conductor 114 to avoid fringing capacitance, which is a type of stray capacitance. It is particularly important to keep the narrow end of the conical inductor away from the fringing capacitance because electrical performance of the narrow end is particularly sensitive to stray capacitance. Unfortunately, this results in raising the wide end 108 of the conical inductor 102 fairly high above the substrate. A manufacturer of conical inductors recommends that the central axis of the coil be elevated between 46 degrees and 60 degrees from the plane of the substrate to avoid stray capacitance with the substrate, particularly its ground plane.

In the embodiment of FIG. 2B, the narrow end of the conical inductor 202 is raised above the top surface of the substrate 218, but the highest point of the conical inductor only extends slightly more than the radius of the wide end. The angle of tilt of the conical inductor is selectable according to the width of the slot and the position of the conical inductor in the slot (e.g. by the back wall of the slot).

Figure 3:
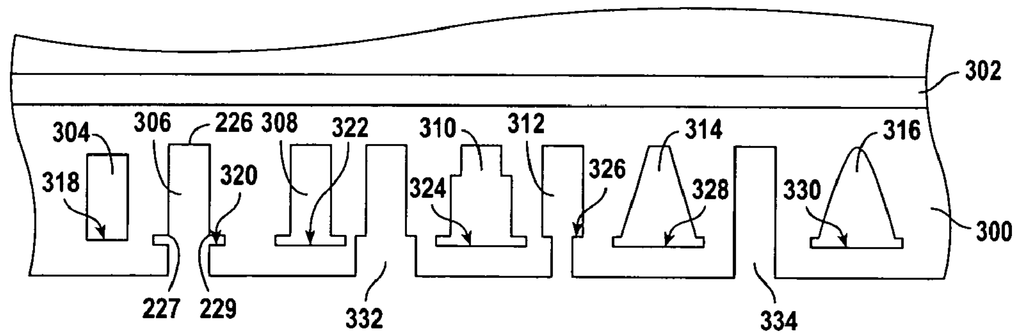
FIG. 3 is a plan view of a substrate with a number of slots for mounting conical inductors according to embodiments of the invention.

FIG. 3 is a plan view of a substrate 300 with a number of slots for mounting conical inductors according to embodiments of the invention. A center conductor 302 is shown only for purposes of illustration. Some slots 304, 306, 308, 310, 312, 314, 316 have back walls 318, 320, 322, 324, 326, 328, 330 that determine the location of the wide end of a conical inductor with respect to the center conductor 302. Other slots 332, 334 do not have back walls, allowing transverse adjustment of the position of the conical inductor with respect to the center conductor 302. Generally, such transverse adjustment also affects the axis of the conical inductor with respect to the plane of the substrate ("tilt"). Thus, slots without back walls also allow adjusting the tilt of the conical inductor.

The slot 306 substantially in accordance with the slot 204 shown in FIG. 2A shows contact points 226, 227, 229 that support the conical inductor on the substrate. Small dots of epoxy are typically applied at these contact points 226, 227, 229 to secure the conical inductor to the substrate. The area of the conical inductor contacted by the substrate and associated epoxy dots is much less, and hence the stray capacitance is much less, than the area would be using a conventional holder. Additional dots of epoxy (see FIG. 2B, ref. num, 228) are optionally added where the last coil of the conical inductor contacts the back wall 320 of the slot 306. Slot 314 is an embodiment of a tapered slot. Slot 316 is an embodiment of a curved slot.

Using slots to position conical inductors is very desirable because the position of conical inductor is determined by its size and the size of the slot, which is typically machined using a precision process, such as laser cutting. Rework is facilitated because the conical inductor is usually attached to the substrate at only a few (typically 3-5) points. The angle of the inductor axis is selectable by varying the dimensions of the slot, and need not be limited to between 45 degrees and 60 degrees, particularly if a cleared portion of the back side of the substrate is provided. Superior electrical performance is obtained because more of the conical inductor is surrounded by free space, rather than epoxy and plastic, avoiding stray capacitances. Finally, using a slotted substrate to position and attach a conical inductor avoids the expense, labor, and imprecision of using a conventional holder.

While the preferred embodiments of the present invention have been illustrated in detail, it should be apparent that modifications and adaptations to these embodiments might occur to one skilled in the art without departing from the scope of the present invention as set forth in the following claims. For example, although specific embodiments have been discussed with reference to microstrip transmission lines, embodiments include other types of planar transmission lines, coaxial transmission lines, and waveguides.

What is claimed is:

1. A circuit assembly, comprising:

a substrate having a slot, a conical inductor disposed in the slot, a conductor of a high frequency transmission line, a lead from a narrow end of the conical inductor being electrically connected to the conductor, and a package suspending the substrate and providing a ground plane acting in cooperation with the conductor to form a microstrip transmission line.

2. The circuit assembly of claim 1 further comprising a recess in the package at least below the conical inductor.

3. The circuit assembly of claim 2 wherein the recess is set back a selected distance from an edge of the conductor to maintain a characteristic impedance of the microstrip transmission line.

4. A circuit assembly, comprising:

a substrate having a slot; and a conical inductor partially disposed in the slot, wherein the substrate is characterized by a top surface within which the slot is formed, and the conical inductor has a wide end characterized by a diameter, and the maximum vertical height of the conical inductor above the top surface is less than the diameter;

further comprising a ground plane on a backside of the substrate, wherein a portion of the ground plane is removed from the backside of the substrate to form a cleared portion underneath at least the conical inductor.

5. The circuit assembly of claim 4 further comprising:

a first conductor of a high frequency transmission line on the top surface of the substrate, a lead from a narrow end of the conical inductor being electrically connected to the conductor;

wherein the wide end of the conical inductor extends below the backside of the substrate.

6. A circuit assembly, comprising:

a substrate having a slot; a conical inductor having a narrow end and a wide end; and the conical inductor partially disposed in the slot;

wherein the slot has a back wall in direct contact with the wide end of the conical inductor.

7. A circuit assembly, comprising:

a substrate having a slot; and a conical inductor partially disposed in the slot, wherein the inductor comprises a conical coil having a narrow end and a wide end, and wherein the slot includes a back wall and a cut-out portion, and the back wall is in direct contact with the wide end of the conical coil.

8. The circuit assembly of claim 4 wherein the conical inductor is secured to the substrate with adhesive.

9. The circuit assembly of claim 4 wherein the conical inductor cooperates with the slot so as to position a narrow end of the conical inductor with respect to a conductor of a high-frequency transmission line.

10. The circuit assembly of claim 6 wherein the back wall cooperates with the wide end of the conical inductor to determine a position of the wide end with respect to a conductor of a high-frequency transmission line.

11. The circuit assembly of claim 4 wherein a narrow end of the conical inductor is raised above the top surface of the substrate.

12. The circuit assembly of claim 4, further comprising:

a conductor of a high frequency transmission line on the top surface of the substrate, and a lead from a narrow end of the conical inductor being electrically connected to the conductor.

13. The circuit assembly of claim 4, further comprising:

a first conductor on the top surface of the substrate, wherein the ground plane cooperates with the first conductor to form a high frequency transmission line.

* * * * *